United States Patent [19]

Maher et al.

[11] Patent Number: 4,882,650
[45] Date of Patent: Nov. 21, 1989

[54] MAGNESIUM TITANATE CERAMIC AND DUAL DIELECTRIC SUBSTRATE USING SAME

[75] Inventors: Galeb H. Maher, North Adams, Mass.; Susan E. Corah, Eagleville, Pa.

[73] Assignee: Sprague Electric Company, North Adams, Mass.

[21] Appl. No.: 279,740

[22] Filed: Dec. 5, 1988

[51] Int. Cl.$^4$ .................. H01G 4/10; H01G 4/12
[52] U.S. Cl. .................. 361/321; 252/62.3 BT; 501/137
[58] Field of Search .................. 501/134–137; 361/320, 321; 29/25.42; 264/60, 61, 67; 252/62.3 BT

[56] References Cited

U.S. PATENT DOCUMENTS

| | | | |
|---|---|---|---|
| 2,972,180 | 2/1961 | Gulton et al. | 361/321 X |
| 3,192,086 | 6/1965 | Gyurk | 156/89 |
| 3,968,412 | 7/1976 | Girard et al. | 361/320 |
| 4,424,615 | 1/1984 | Wakino | 361/321 X |
| 4,428,895 | 1/1984 | Blasch et al. | 264/28 |
| 4,490,429 | 12/1984 | Tosaki et al. | 428/195 |
| 4,567,542 | 1/1986 | Shimada et al. | 361/321 |
| 4,610,971 | 9/1986 | Wada et al. | 501/137 |
| 4,620,264 | 10/1986 | Ushifusa et al. | 361/414 |
| 4,630,171 | 12/1986 | Dubuisson et al. | 361/321 |
| 4,633,366 | 12/1986 | Maher | 361/321 |

*Primary Examiner*—Donald A. Griffin

[57] ABSTRACT

The average chemical composition of a reaction band at the interface adjacent co-sintered layers of barium titanate and a low K magnesium zinc titanate is found to be $Mg_{0.5}Ba_{0.25}Zn_{0.25}TiO_3$. That magnesium barium zinc titanate is further shown to be compatible physically and chemically with barium titanate when the two are made adjacent in the green state and are themselves subsequently co-sintered. The preferred structure for use as a printed-wiring substrate capable of containing surface and buried capacitors and resistors, is a stack having a barium titanate layer sandwiched between two magnesium barium zinc titanate layers. The ratio of the dielectric constants (K) of the two materials exceeds 100. Thus, there is the possibility for making large value capacitors buried in the barium titanate while there is little capacitance and cross-talk between conductors in the outer low K material layers.

18 Claims, 1 Drawing Sheet

MAGNESIUM TITANATE CERAMIC AND DUAL DIELECTRIC SUBSTRATE USING SAME

BACKGROUND OF THE INVENTION

This invention relates to a multilayer ceramic substrate or body having two adjacent layers of different composition and dielectric properties such as disparate dielectric constants.

Such bodies are typically used as substrates that include buried conductors and buried capacitors. Some employ conductive vias for making electrical interconnection between layers of conductors. It is also known to metallize portions of an outer surface of such bodies and to mount discrete electrical components thereto, e.g. semiconductor integrated circuits, and/or forming on the body and in it film components such as resistors. It is desirable to form such buried circuits and surface components in and on a low dielectric constant material to minimize interwiring capacitance and consequent "cross talk". On the other hand, it is often highly desirable to form buried capacitors within a high dielectric constant body to minimize the physical size and cost of the capacitor.

The above-noted low K materials when combined in the green state with a layer or layers of barium titanate and sintered to a dense mature compound body, exhibit at each interface with the barium titanate, a band of an integrated material wherein some of the elements of each of the two start materials have co-reacted. This interface band generally exhibits a gradient of dielectric properties, e.g. dielectric constant, DF, and TC, that are quite different than that of either start material, i.e. either of the low K material or the high K barium titanate layer. This band cannot be used as a capacitor dielectric in practice because of its varying and uncertain dielectric properties. The thickness of this interface band of co-reacted material in compound prior art bodies is typically 0.025 to 0.065 mm (1.0 to 2.6 mils). It is good practice to relegate even wider bands of material at such interfaces to non-use and safely avoid unexpected and degraded performance of capacitors formed therein.

Also, the compound ceramic bodies of the prior art that combined a high dielectric constant barium tianate layer with a low dielectric constant layer have a strong tendency to develop catastrophic cracks due to large differences in the thermal coefficients of expansion of these two dissimilar materials. This severely limits the overall compound-body size that can be reliably manufactured.

Other prior art devices have a high dielectric layer sandwiched between two layers of a low dielectric ceramic composition, in which the outer layers are made as thick or thicker than the high dielectric constant layer to ameliorate the tendency of these compound bodies for cracking. Such a limitation on sandwiched ceramic bodies more often leads to thicker and larger packages than desirable and than would otherwise be necessary.

It is an object of the present invention to provide a low dielectric constant ceramic material that may be combined in a composite body with and reliably co-sintered with a barium titanate.

It is a further object of this invention that said ceramic material be chemically and physically compatible at co-sintering with barium titanate.

It is another object of the present invention to ameliorate the above-noted shortcomings of the prior art.

It is a further object of this invention to form a multilayer compound ceramic body having an inner layer of barium titanate sandwiched between two layers of said ceramic material having a dielectric constant at least 100 times less than that of the barium titanate.

SUMMARY OF THE INVENTION

A low dielectric constant ceramic is comprised of a magnesium barium zinc titanate, the molar quantities of barium and of zinc each being within 40 to 60% the molar amount of titanium. This low K material has a dielectric constant less than two orders of magnitude relative to the dielectric constant of substantially all ceramics comprised of more than 85 weight percent $BaTiO_3$. Furthermore, it has a commensurate coefficient of expansion, e.g. the shrinkage following sintering is within about 10% that of such a barium titanate. And further yet, in a compound substrate this low K magnesium barium zinc titanate is also chemically compatible with such high K barium titanates; namely, a narrow reaction zone and a strong bond is formed between them. Thus, in a further aspect of this invention, a substrate comprises a layer of a barium titanate bonded adjacent one layer or preferably sandwiched between two layers of the above-mentioned magnesium barium zinc titanate all having been co-sintered. This invention provides a compound ceramic sandwich wherein each layer in the sandwich is of homogeneous ceramic composition in directions parallel to the interface between layers.

DESCRIPTION OF THE PREFERRED EMBODIMENTS

A series of compound bodies were made and tested to determine their suitability as multilayer compound-ceramic substrates.

EXAMPLE A (combining #1 with #3)

Figure 1:
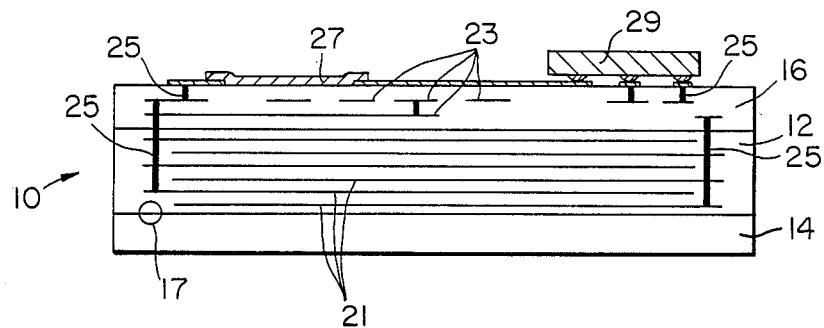
FIG. 1 shows in side sectional view a multilayer compound ceramic substrate of this invention with buried electrical components formed within, and with electrical components formed on and mounted to an outer surface of the substrate.

A number of substrates 10 as illustrated in FIG. 1 were made having a high dielectric-constant layer 12 sandwiched between two low dielectric-constant layers 14 and 16. The first such substrates were made by preparing a ceramic slurry comprised of a liquid organic vehicle including a binder and a fine low dielectric constant (K) ceramic powder of a magnesium zinc titanate, and subsequently forming a green layer by the standard method of repetitively depositing and drying a stack of films of the ceramic slurry to form a first green ceramic layer to become layer 14. Such a standard method is further described in the Maher U.S. Pat. No. 4,266,265 issued May 5, 1981 and assigned to the same assignee as is the present invention.

Then, another ceramic slurry comprised of the liquid organic vehicle and a high K ceramic powder was repetitively deposited and dried with intervening films of electroding ink to similarly form a second green layer to become layer 12 on the first green layer 14. Another low K layer to become layer 16 was formed again by the same method on the green high K layer 12. After heating to about 400° C. to drive off the binder, that stack or compound body of green ceramic layers was then fired at 1100° C. for 2½ hours to drive off the organic materials and to co-sinter the green layers to form the mature high K layer 12 and the low K layers 14 and 16 that are by that sintering step co-reacted and bonded together.

The mature ceramic layer 12 has the composition #1 of Table I. The mature outer ceramic layers 14 and 16 have the composition #3 of Table I.

TABLE I

COMPOSITIONS

| # | by molar quantities in subscripts and by weight in (parentheses) |
|---|---|
| 1. | (100) $BaTiO_3$ (1.0) $Bi_2O_3$ (1.0) PbO (1.0) ZnO (1.7) $Nb_2O_5$ (0.7) $B_2O_3$ |
| 2. | (97) $BaTiO_3$ (1.0) $Nb_2O_5$ (2) 5CdO · 2$SiO_2$ |
| 3. | (98) $Mg_{0.67}Zn_{0.33}TiO_3$ (2) $CdZn_2B_2O_6$ |
| 4. | (98) $Mg_{0.5}Ba_{0.25}Zn_{0.25}TiO_3$ (2) $CdZn_2B_2O_6$ |
| 5. | (98) $Mg_{0.65}Ba_{0.10}Zn_{0.25}TiO_3$ (2) $CdZn_2B_2O_6$ |
| 6. | (98) $Mg_{0.35}Ba_{0.40}Zn_{0.25}TiO_3$ (2) $CdZn_2B_2O_6$ |

Sintering was accomplished at 1100° C., which is made possible by the inclusion of the silica based sintering flux #2 in Table I. The barium, titanium, niobium and other elements were included in the start powder of composition #1 as the oxides BaO, $TiO_2$ and $Nb_2O_5$. Likewise the start powder of composition #3 was comprised of oxides (or equivalents such as carbonates and oxylates) of the elements magnesium, zinc titanium. The making of compound substrates by this method leads to a thick and pronounced reaction band formed at the interface between adjacent layers of the high and low K materials.

A second making of substrates by this method used a prereacted magnesium zinc titanate, i.e. $Mg_{0.67}Zn_{0.33}TiO_3$ was calcined at 1150° C. before introduction to the start materials.

Figure 3:
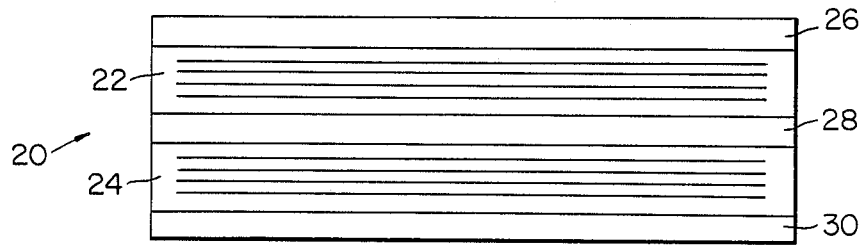
FIG. 3 shows in side sectional view another multilayer compound ceramic substrate of this invention.

These later made substrates were sectioned and a portion 17 of the interface region between the high K layer 12 and the low K layer 14 was magnified by electron microscope (X 1000) and is illustrated in FIG. 3. There a still pronounced well-defined interface-band 18 was seen, but it is of a reduced thickness 19 of about 1.5 mils (0.06 mm). It is thus preferable to precalcine the barium titanate of composition #1.

Analysis of the average composition of this interface band 18 was determined by SEM to be $Mg_{0.5}Ba_{0.25}Zn_{0.25}TiO_3$. However, the interface band of the co-reacted material is not homogenous and is believed to have a wide range of compositions and dielectric properties in a direction from the low K to the high K layers.

In FIG. 1, there are also shown buried metal film electrodes 21 forming plates of a buried capacitor formed in the high K material of layer 12. There are also metal film conductors 23 buried in the low K material of layer 16 which are interconnected by conductive vias 25. On the surface of the low K layer 16 there are formed a film resistor 27 and there is attached an integrated circuit package 29. High K materials are advantageous in those areas in which capacitors are buried, and low K material is advantageous in other areas of that wiring board in which buried low-cross-talk wiring layers are desired. Conventional methods may be used to provide these buried electrodes and conductors, e.g. printing patterns of electroding ink between successive depositions of ceramic slurry and cofiring with the ceramic, conventional methods are described in the Mayer U.S. Pat. No. 4,633,366 issued Dec. 30, 1986 and assigned to the same assignee as is the present invention. Neither the experimental substrates of EXAMPLE 1 nor any of the following Examples, except where noted, included these additional features.

EXAMPLE B (combining #1 with #4)

Another group of substrates were made by the same steps as were used for making the later-made EXAMPLE A substrates except that the low K composition #4 (that corresponds to the average composition found in the interface reaction bands: e.g. 18, of FIG. 2 substrates) was substituted for the low K composition #3 in layers 14 and 16.

At the interfaces between high and low K layers, e.g. 12 and 14 respectively, there is a mild and barely perceptible reactron band at 1000X magnification and it is about half the width of the prominent reaction band in Example A substrates. For practical purposes, the reaction band has been eliminated since very little diffusion and reaction of elements from either layer has taken place in the other.

EXAMPLE C (combining #2 with #4)

Figure 2:
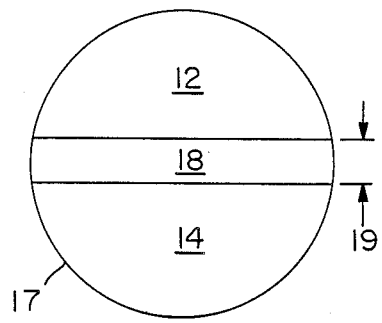
FIG. 2 shows a magnified detail portion 17 of the substrate of FIG. 1.

Yet another group of substrates of the kind illustrated in FIG. 2 were made. The high K start material is a precalcined barium titanate doped simply with niobium to which a borate flux is added, composition #2 in Table I. The low K start material is the precalcined magnesium barium titanate with a silicate flux added, composition #4. The amount of binder in the start slurry from which the outer low K layers are to be formed was empirically adjusted so that the amount of shrinkage of the outer layers from the green state to the sintered state is about equal that of the center high K layer.

The faint reaction band in these substrates seen at 1000X magnification was essentially of the same character and extent as that in substrates of Example B. There is found the usual trade-off between K and temperature coefficient of capacitance (TCC) referring to Table II, but it appears that all high K (K 1500) barium titanates (defined herein as ceramics having more than about 85 weight percent $BaTiO_3$) will co-sinter similarly with low K magnesium barium zinc titanates, e.g. those wherein the barium and zinc are each present within about 40 to 60 mole percent of the magnesium.

TABLE II

| PROPERTIES OF COMPOSITIONS | | |
|---|---|---|
| # | K | TC |
| 1. | 2600 | X7R |
| 2. | 4300 | X7S |
| 3. | 20 | COG |
| 4. | 23.6 | COG |
| 5. | 21.3 | COG |
| 6. | 64 | COG |

EXAMPLE D (TCE measurements)

A set of experimental substrates were made as follows:

D-1 composed entirely of ceramic composition #1;
D-2 composed entirely of ceramic composition #2:
D-3 composed of one high K layer of composition #4;
D-4 composed of a high K layer 6 mils (0.15 mm) thick of composition #1 sandwiched as in FIG. 2 between two layers 15 mils (0.38 mm) thick of low K ceramic composition #3; and
D-5 composed of a low K layer 6 mils thick of compostion #2 sandwiched as in FIG. 2 between two layers 15 mils thick of low K ceramic composition #3.

The length of each substrate is 340 mils (8.5 mm) while the thickness of each substrate is between 34 and 38 mils. By monitoring the length of each substrate as it cooled from the peak sintering temperature of 1100° C. to 25° C., it was seen that the substrates D-3, D-4 and D-5 shrank essentially the same amount; namely, from 12 to 12.7%; whereas substrates D-1 and D-2 shrank 14%. From these data it seems certain that in the sandwiched constructions, the center layer (12) of high K material is under tension at room temperature (25° C.).

Since ceramic materials are much stronger in compression than in tension, one would conclude from this data that it is preferable to provide two low K layers 14 and 16 having a total thickness much greater than the high K layer 12.

However, the sintered substrates were then subjected to testing by slowly increasing the temperature from 15° C. to 475° C. while measuring their change in length. The temperature coefficient of expansion (TCE) for each substrate was calculated and is presented in Table III.

TABLE III

| Substrate | TCE $10^{-6}$mm/mm/°C. |
|---|---|
| D-1 | 10.7 |
| D-2 | 11.4 |
| D-3 | 9.9 |
| D-4 | 10.2 |
| D-5 | 10.2 |

The TCE of these two compound substrates D-4 and D-5 also tracks very closely the characteristic TCE of the low K layers, D-1 and D-2. The high K layer in each case being in a state of tension at room temperature is apparently elastic enough to follow very nearly the dimensions of the outer layers. In series of experiments, thickness of the outer layers was varied from equal to the thickness of the inner layer to three times that thickness. The incidence of cracks in the inner layer became less as the outer layer thickess became less.

Thus it is preferred to keep the low K outer layers relatively thin; namely, less than half the thickness of the inner layer.

EXAMPLE E (combining #2 and #5)

The experiment of Example C was repeated except the low K material composition #4 was altered whereby a lower molar ratio of zinc to magnesium (0.39) were effected to produce the composition #5 (Table II). These ratios in composition #4 were both 0.5. These parts cracked at the middle of the high K layer because of greater stresses in the composite substrate during cooling from the 1100° C.

EXAMPLE F (combining #1 and #6)

The experiment of EXAMPLE C was repeated again except this time, the low K material composition #4 was altered whereby a higher ratio of barium and zinc to magnesium was effected. There was no splitting of these units as they cooled but the dielectric constant K was raised substantially to 64 (Table II) and the dielectric constant ratio of the high K layer to that of the low K layers drops well below the desired ratio of at least 100.

EXAMPLE G

A number of experimental substrates were made composed of a 16 mils (0.4 mm) thick high K layer of composition #1 sandwiched between two layers of 5 mils (0.13 mm) thick low K ceramic composition #4 of this invention. The overall thickness of each sintered compound substrate of EXAMPLE G is about 27 mils (0.69 mm). The length and width are 120 mils (3.0 mm) and 60 mils (1.5 mm).

The strength of these compound substrates was compared with a number of substrates having the same overall dimensions but being composed only of composition #1 in one series and composition #2 in another.

These data are shown in Table IV.

TABLE IV

| | SUBSTRATE COMPOSITIONS | | |
|---|---|---|---|
| | #1 | #2 | Example G |
| Average Thickness (mils) | 28.4 | 23.5 | 26.9 |
| Average Fracture (lbs.) | 3 | 5.3 | 11.8 |
| Number of Substrates | 8 | 8 | 16 |

Substrates of the same sandwich composition and structure, Example C, except having length and width of dimensions of 1 inch by 1 inch (26 mm×25 mm) were made with no cracks.

The sintering flux $5CdO·2SiO_2$ is not critical and may alternately by $Cd_3SiO_5$, $Cd_2SiO_4$, $CdSiO_3$ or mixtures of these, or any of many sintering fluxes that reduce the sintering temperature of the barium titanate composition, e.g. composition #2 of Table I. Likewise, the sintering flux in the low K material of this invention may be $MgZnB_6O_9$, $CdZnB_2O_5$, $Mg_3B_2O_6$ or combinations of these borates.

A compound ceramic substrate 20 is illustrated in FIG. 3. There two multilithic ceramic capacitors are formed, respectfully, in two barium titanate, layers 22 and 24. Each capacitor layer 22 and 24 is sandwiched between a pair of layers of the composition #4 of this invention, respectively, pairs 26 and 28, and pairs 28 and 30. In this structure the capacitors in layers 22 and 24 are dielectrically isolated from each other by low K layer 28 and from any wiring or components that may be formed in and on the outer low K layers (not shown).

Another ceramic sandwich structure, employing a fine and nearly monodisperse ceramic as an inner layer while the pair of outer layers have a broad range of ceramic grain sizes, is disclosed in the Maher U.S. patent application Ser. No. 07/279,739, filed simultaneously herewith entitled "Monolithic Compound-Ceramic Capcitor".

What is claimed is:

1. A ceramic composition comprising a magnesium zinc barium titanate wherein the molar quantities of barium and of zinc are each within 40 to 60% that of magnesium.

2. The ceramic composition of claim 1 wherein the molar quantity of titanium is from 1.6 to 2.6 times that of said magnesium.

3. The ceramic composition of claim 1 in the form of a sintered polycrystalline magnesium barium zinc titanate body having from 1 to 5 weight percent of a sintering flux at the grain boundaries in said polycrystalline body.

4. The ceramic composition of claim 3 wherein said flux is a glass flux selected from silicates, borates and combinations thereof.

5. The ceramic composition of claim 4 wherein said flux is selected from $Cd_3SiO_5$, $Cd_2SiO_4$, $CdSiO_3$ and mixtures thereof.

6. The ceramic composition of claim 4 wherein said flux is a borate selected from $Mg_2ZnB_6O_9$, $CdZnB_2O_5$, $Mg_3B_2O_6$ and combinations thereof.

7. The ceramic composition of claim 1 wherein said magnesium zinc barium titanate is $Mg_{0.5}Ba_{0.25}Zn_{0.25}TiO_3$.

8. A ceramic substrate comprising a sintered ceramic body that is comprised of from 95 to 99 weight percent of a high-firing polycrystalline magnesium barium zinc titanate, wherein by molar quantities said barium and said zinc amount to from 40 to 60% of said magnesium, and from 1 to 5 weight percent of a sintering flux.

9. The ceramic substrate of claim 8 wherein the molar quantity in said body of said magnesium is from 45% to 55% of the molar amount of said titanium.

10. The ceramic substrate of claim 8 wherein the molar ratio of said titanium to the sum of said magnesium barium and zinc is $1 \pm 0.02$.

11. The ceramic substrate of claim 8 additionally comprising a layer of a barium titanate ceramic having been co-sintered with and to one surface of said magnesium zinc barium titanate body.

12. The ceramic substrate of claim 11 additionally comprising a pair of spaced apart electrode sheets buried in said barium titanate layer to form a capacitor therein utilizing a portion of said barium titanate layer as the active capacitor dielectric.

13. The ceramic substrate of claim 12 additionally comprising another sheet electrode in said layer lying near the interface of said barium titanate layer and said magnesium barium zinc titanate body in capacitive relationship with one of said pair of electrode sheets.

14. The ceramic substrate of claim 11 additionally comprising a block of the same ceramic composition as that of said sintered ceramic body having been co-sintered with and to the opposite surface of said barium titanate layer.

15. The ceramic substrate of claim 14 wherein the thickness of said barium titanate layer is greater than the sum of thicknesses of said body and said block.

16. The ceramic substrate of claim 15 wherein said thicknesses of said body and said block are essentially equal to each other.

17. The ceramic substrate of claim 11 additionally comprising a pair of spaced apart electrode sheets in said layer, and a block of the same ceramic composition as that of said sintered ceramic body having been co-sintered coadunate with the opposite surface of said layer.

18. The ceramic substrate of claim 11 wherein said barium titanate layer at temperatures within the range $-55°$ C. to $125°$ C. is in a state of tension and said ceramic body and block are in a state of compression.

* * * * *

UNITED STATES PATENT OFFICE
CERTIFICATE OF CORRECTION

Patent No. 4,882,650          Dated November 21, 1989

Inventor(s) Galeb H. Maher and Susan E. Corah

It is certified that error appears in the above-identified patent and that said Letters Patent is hereby corrected as shown below:

Column 3, line 48, "FIG. 3" should read -- FIG. 2"
Column 4, line 7, the comma after "ceramic" should read -- . Such --
          line 8, "Mayer" should read -- Maher --
          line 26, "reactron" should read -- reaction --
Column 5, line 7, "high" should read -- low --
          line 52, after "In" should be -- a --
Column 6, line 40, "Example C" should read -- Example G --

Signed and Sealed this

Sixth Day of November, 1990

*Attest:*

HARRY F. MANBECK, JR.

*Attesting Officer*        *Commissioner of Patents and Trademarks*